United States Patent [19]

Dietl et al.

[11] Patent Number: 4,787,986
[45] Date of Patent: Nov. 29, 1988

[54] PROCESS AND APPARATUS FOR MELTING SILICON POWDER

[75] Inventors: Josef Dietl, Neuötting; Jörg Kotilge, Mehring-Öd, both of Fed. Rep. of Germany

[73] Assignee: Heliotronic Forschungs- und Entwicklungsgesellschaft fur Solarzellen-Grundstoffe mbH, Burghausen, Fed. Rep. of Germany

[21] Appl. No.: 86,960

[22] Filed: Aug. 18, 1987

[30] Foreign Application Priority Data

Aug. 28, 1986 [DE] Fed. Rep. of Germany ....... 3629231

[51] Int. Cl.$^4$ .............................................. B01D 17/00
[52] U.S. Cl. .................... 210/773; 156/662; 210/774; 210/175
[58] Field of Search ................ 422/249, 106; 210/767, 210/773, 774, 175; 156/617 SP, 617 M, 617 H, 617 V, 621, 624, 662

[56] References Cited

U.S. PATENT DOCUMENTS

| 4,151,264 | 4/1979 | More et al. |
|---|---|---|
| 4,410,494 | 10/1983 | Fiegl ..................................... 422/110 |
| 4,454,096 | 6/1984 | Lorenzini et al. ................... 422/249 |

Primary Examiner—Frank Sever
Attorney, Agent, or Firm—Collard, Roe & Galgano

[57] ABSTRACT

A process for continuous or batchwise melting of silicon powder in particular, powder having a large amount of fines, and a melting crucible for carrying out this process are specified. The melting crucible is designed so that a melt pool having a certain minimum height and which is covered by unmelted silicon powder is provided. Thus, added material first comes into contact with silicon powder which is already present and only gradually reaches the melting zone. The amount of melt produced which exceeds the minimum height of the melt pool flows out of the melting crucible. The minimum height is maintained in the process by using a crucible which has a siphon-like outlet in the base.

9 Claims, 1 Drawing Sheet

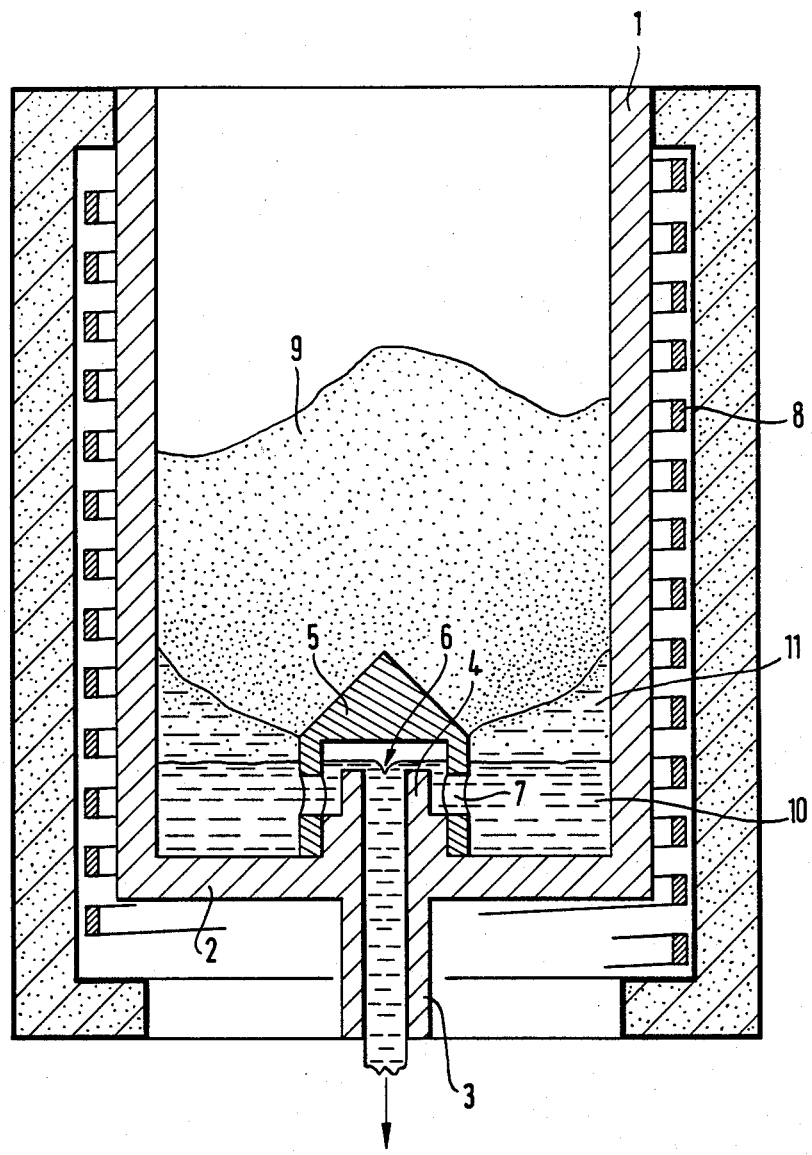

PROCESS AND APPARATUS FOR MELTING SILICON POWDER

BACKGROUND OF THE INVENTION

1. Field of the Invention

This invention relates to a process for melting silicon powder charged into a melting crucible, and a melting crucible for carrying out this process.

2. Description of the Prior Art

As is known, generating melts of silicon powder or dust has proven difficult. In particular, this difficulty arises when fractions having a high proportion of particles with a grain size of less than 1 mm are involved. Such fine-grain powder fractions are produced in large amounts when sawing silicon rods or blocks, crushing or grinding polycrystalline silicon deposited in rod form, or during silicon deposition by the fluidized bed process. German Patent No. 2,706,175 and the corresponding U.S. Pat. No. 4,151,264 teach that a fine silicon dust, which is produced as a waste product during grinding of silicon lumps, can be successfully melted, e.g., in a silicate slag with added copper. However, the silicon attained in this process is unsuitable for applications in which high purity is required if only due to the amount of copper absorbed. Also, additional costs are incurred because of the cost of the slag and the necessity of using a large-capacity melting crucible due to the large amount of material to be melted in addition to the silicon.

In another prior art melting process, a melting crucible is completely filled with silicon powder and this charge is then melted down. Since the silicon powder is less dense than the molten silicon, the melting crucible is only filled to a comparatively small extent after melting the silicon. The crucible must again be designed for a large capacity in order to accommodate the voluminous starting material. Using a large crucible results in an increasingly unfavorable energy utilization and increased crucible corrosion. This is because of crucible overheating which is necessary for producing a melt and which becomes greater with increasing crucible volume.

In addition, it is extremely difficult to charge additional silicon powder into the melt in order to improve the degree of crucible filling. This is because there is considerable liberation or silicon monoxide, which is so vigorous that it frequently can remove the entire content of the crucible. This release is inevitable because of the reaction of the powder to the melt due to the oxide skin generally covering the powder particles.

These difficulties have often been overcome by first eliminating the fine component from the silicon powder which is to be melted. This is an expensive grading step because the fines are difficult to handle, and fines are discarded which, per se, serve as a valuable source of raw material.

SUMMARY OF THE INVENTION

It is an object of the invention to provide a process and apparatus which allows, in particular, for the continuous melting of silicon powder, especially that with a large fine component, which is economical to employ and produces a high purity product and avoids the disadvantages of the prior art.

This object is achieved by a process wherein the powder bed placed in the melting crucible is always kept covered during the melting process by a layer of unmolten silicon powder. Further silicon powder is added continuously or cyclically, onto the layer of unmolten silicon powder already present. Only the silicon melt produced by the part of the powder bed passing into the melting zone is drawn off from the crucible.

With this process, the added silicon powder is gradually freed of the adhering oxide skin while it slowly passes into the melting region. When the powder enters into the melting zone and during melting the oxide has been removed as completely as possible and vigorous reactions no longer occur.

The process is also suitable, in principle, for melting silicon lumps. However, it is employed with particular advantage in melting silicon powders which, because of their large fine components, can be melted in a conventional fashion only after removal of the fines. Such powders are produced during the grinding or crushing of crude silicon or polycrystalline silicon deposited in a tube or rod form. Such powders are also deposited during the deposition of highest purity silicon on fine silicon particles in a fluidized bed reactor, during acid leaching of silicon granules, optionally associated with mechanical treatment, leading to continuous grain reduction, or in a process carried out in a chamber filter press, or during sawing-up of silicon rods or blocks. Experience has shown that melting these powders is more difficult to control as the extent to which the proportion of fine grains which pass through a sieve of mesh size of about 1 mm increases. Great difficulties can arise even with a ratio of about 1% by weight of fines to the total amount of silicon. These difficulties apply especially to the slurry from sawing which is extremely difficult to melt because it mostly contains grains which can pass through a sieve of mesh size 5 $\mu$m. Also, fines produced in making acid-purified silicon, which is used as starting material for solar cells and which has been comminuted in vibration grinding mills or air jet mills, are difficult to melt. This powder has a high proportion of particles which pass through a sieve of mesh size 70 $\mu$m. Even those powders which have hitherto been regarded as unsuitable for controlled melting can be melted without a problem utilizing the process according to the invention.

In this process, subsequent addition can occur in principle continuously or batchwise. However, it is always important to match the amounts of added and melting material to one another so that the powdered silicon is never introduced directly into the molten material, but instead is always added onto a layer of silicon powder covering the melt. The amount of melting can be controlled by the heating power or energy supplied to the melting crucible. This heat energy may be supplied via radiant heating, resistance heating or induction heating. The amount of added material can be matched to the demand with the aid of suitable metering devices, for example shaking chutes or worm conveyors. According to the favorable and preferred embodiment, part of the silicon melt produced in the crucible is collected in the crucible base, in the form of a melt pool having a certain minimum height, and only the amount of melt exceeding this minimum height is drawn off from the crucible.

The minimum melt height in the melting crucible is expediently set by providing one or more outlet apertures at a predetermined height which permits the excess amount of melt to flow out. For this purpose, a siphon having the necessary height is preferably provided in the base of the melting crucible to allow for the outflow of the melt. Also, for example, there can be one or more outlet apertures placed in the external walls of the crucible, which operate by the siphon principle.

In this way, the amount of material present in the molten state can be kept at a minimum. Although even lower values may be possible in principle, a melt pool height of at least 1 mm, and preferably at least 5 to 15 mm, is provided. This melt height is generally sufficient to cause the silicon powder to gradually sink and be melted in a manner whereby only molten material leaves the crucible. The danger of causing the melt pool to solidify due to sinking powder is low since the charged powder passes through increasingly hotter zones of the melting crucible while sinking and consequently the powder reaches virtually the melting temperature just before immersion into the melt pool. Even if solidification should occur, a melt pool can generally be regenerated merely by slightly increasing the heating power supplied to the melt zone.

Certain of the foregoing and related objects are also achieved by the provision of a hollow melting crucible for melting silicon powder. The crucible has a base with generally vertically extending side walls. A melting zone is provided adjacent the base and an outlet located a predetermined height above the base whereby the molten silicon within the base is maintained at a constant minimum height. A cover extends over the outlet to prevent powdered silicon from entering the outlet.

Materials which can be employed for a melting crucible suitable for carrying out the process according to the invention are, in principle, the known crucible materials which are inert or substantially inert towards molten silicon. These are, for example, quartz, silicon carbide or silicon nitride. In addition, graphite has been found to be especially good for use as a crucible material, preferably in high density or surface-coated form as by Impor coating (impregnation with organic liquid and subsequent decomposition). However, if the purity demands placed on the molten material permit, other materials which are solid at high temperature may be used such as corundum or aluminum nitride, which are sometimes not used due to the danger of melt contamination.

These and other objects and advantages of the present invention will become apparent from the following description of the accompanying drawing, which illustrates one embodiment of the present invention. It is to be understood that the drawing is to be used for the purpose of illustration only, and not as a definition of the invention.

BRIEF DESCRIPTION OF THE DRAWING

The drawing is a schematically-illustrated cross-sectional view of the melting crucible of the present invention.

DESCRIPTION OF THE PREFERRED EMBODIMENT

Referring to FIG. 1, the melting crucible 1 is, for example, a hollow cylinder which has, in its base 2, an outlet 3. Above outlet 3 there is a siphon-like cap 4 which allows the molten phase formed in the crucible to exit through outlet aperture 6 thereby maintaining a certain minimum melt height. In addition, a cover 5 is advantageously provided above cap 4 to keep the outlet aperture 6 of cap 4 free of sinking, non-molten material.

Molten material reaches the outlet aperture 6 through flow passages 7 which, for example, are in the form of holes or slots, in the cover 5. The molten material then flows over cap 4 into outlet aperture 6 and leaves the crucible through the outlet 3. The melting crucible 1 is advantageously surrounded up to about 40 to 100% of the crucible height by a crucible heater 8. The heater 8 may have various heating zones which can be advantageously separately controlled. Thus, the amount of energy supplied to the crucible contents can be controlled to prevent, for example, the molten phase from rising too high within the crucible.

The melting process, according to this invention, can be initiated by filling the melting crucible 1, while cold, from 30 to 100% full with silicon powder 9 and then heating to the working temperature. Alternatively, the silicon powder 9 can be charged into the crucible which has already been heated to the working temperature.

The silicon powder located in the hottest zone of the melting crucible then gradually begins to melt and finally forms the melt pool 10. Melt pool 10 expands out farther until it has reached the minimum height predetermined by the outlet aperture 6. Above the melt pool 10, an incipient melting zone 11 is formed in which the temperature is already in the region of the melting temperature of silicon. Thus the individual powder particles begin to melt at the surface of zone 11 and finally melt completely on contact with the melt pool 10. The excess amount of melt produced during the process flows out of the crucible through the outlet aperture 6 and the outlet 3. The melt outflow can be subjected to further treatment, for example directional solidification or purification by vacuum treatment.

As molten material leaves the crucible 1, a corresponding amount of further silicon powder can be added to the powder bed 9 for melting. However, it is not necessary that the amount of powder supplied be matched strictly to the amount of melt drawn off. These quantities can vary within broad limits as long as the limiting cases, namely, overfilling the crucible or direct charging of the powder into the melt pool are avoided.

One elegant way of adding additional powder comprises introducing the silicon powder via a snorkel tube (not shown). The snorkel may be made, for example, from graphite, whose outlet dips into the powder bed in the crucible. As long as this outlet is covered by powder, the flow of powder within the snorkel tube is held back. When the powder level in the crucible has fallen so far that the outlet of the snorkel tube becomes free, powder begins to trickle out of the inside of the tube. When the powder level rises, flow is stopped when the outlet is covered again. This type of system is self-regulating to a certain extent. Another way to add powder is a shaking chute (not shown), which, for example, can either be employed to introduce the material to be melted either continuously or batchwise into the crucible interior.

With many crucible materials, in particular graphite, the fill level of the crucible can be advantageously optically monitored since the crucible walls and the silicon powder exhibit clearly different glow behavior. This fact allows the use of noncontact temperature measuring instruments such as pyrometers for checking the fill level.

When a continuous or constant supply of powder is utilized, it is preferred that the melting process, and thus ultimately the fill level in the crucible, be controlled via the heating power supplied. However, it is also possible, in principle, to control the melting process by varying the supply of powder at a constant heat input or to vary both parameters. In any case, the cross section of the outlet 3 places an upper limit on the amount of molten silicon flowing out of the crucible in a unit time.

As melting and outflow of the silicon powder located in the region of melt pool 10 continues, the silicon powder added gradually passes into hotter and hotter zones of the melting crucible. At the same time, the oxide skin on the surface of the silicon particles begins to evaporate off in the form of volatile silicon monoxide. This evaporation constantly increases with increasing temperature so that, finally, the material is virtually oxide-free on immersion into the melt pool and can be melted completely without interference.

The outlet aperture 6 and outlet 3 through which the silicon, melted in this fashion, finally leaves the melting crucible need not necessarily have a circular cross section. Polygonal, for example, prismatic, quadratic, pentagonal or hexagonal cross sections, and slot-like or oval cross sections, are equally suitable. Similarly, the cap or siphon 4 which determines the shape and which extends from the crucible base may be of any of the specified shapes.

According to a preferred embodiment, the outlet aperture is provided with a cover 5 which prevents unmolten material from penetrating into the outlet. In this case, the cover 5 has a shape which tapers to a point in an upward direction. For example, a cone, pyramid or wedge shape can be favorably selected. This pointed shape prevents the creation of dead spaces which interfere with the downward movement of the powder material. Advantageously, the cover 5 may be secured against displacement by the silicon powder moving down within the crucible by fitting into a corresponding recess in the base of the crucible 1 or by matching and fitting over the base area of the cap 4.

The process according to the present invention and melting crucible herein disclosed for carrying out this process permits even very fine silicon powder to be melted continuously. During the process the silicon is only present in the crucible in the molten state in a small amount and for only a short time. Consequently, both the energy losses, for example, as through radiation dissipation, and contamination of the melt by the crucible walls can be kept low. In addition, large amounts of silicon powder can be melted using relatively small-capacity crucibles. The process is expediently carried out in an inert atmosphere such as argon, at atmospheric or reduced pressure.

The invention will now be explained more fully by way of an example which is, however, only given by way of illustration and not of limitation.

EXAMPLE

A cylindrical melting crucible designed according to the drawing made from high-density graphite with an internal diameter of about 110 millimeters (mm), an internal height of about 240 mm, and a wall thickness of about 10 mm was employed. The crucible had at its base an outlet whose outlet aperture has a diameter about 10 mm which was disposed about 6 mm above the level of the crucible base so as to act as a siphon. A cap was formed around the outlet in the shape of a stepped graphite cylinder. A cover, tapering conically in an upward direction and protecting the outlet aperture by keeping it open was placed over the cap. At intervals of 90° around the cover, holes were formed in the cover (diameter about 10 mm) which permitted molten material to enter the outlet aperture. This arrangement was situated in an evacuated container in which an argon pressure of approximately 100 mbar had been set.

The crucible was filled from a silicon reservoir to about 70% with silicon powder of average grain size 20 $\mu$m with the aid of a shaking chute. The crucible was then heated until molten silicon began to flow out of the outlet. The heating power was then reduced somewhat, and silicon powder was added continuously with the aid of the shaking chute, to the powder located in the melting crucible. The material height in the melting crucible, as observed through an inspection window in the container, was kept approximately constant. The molten silicon flowing out was collected in a suitable vessel.

An amount of about 30 kg of silicon powder of average grain size 20 $\mu$m was successfully melted within one hour by this process and with the aid of the melting crucible specified.

As can be seen from the foregoing, the present invention provides an extremely effective process and apparatus for melting silicon powder.

While only one embodiment and example of the present invention has been described, it is obvious that many changes and modifications may be made thereunto, without departing from the spirit and scope of the invention.

What is claimed is:

1. A hollow melting crucible for melting silicon powder, the crucible having a base and generally vertically extending side walls, comprising:
    a melting zone adjacent the base; and
    an outlet aperture formed in the base of the crucible and having an inlet located at a predetermined height above the base including means for enabling molten silicon in said melting zone to be maintained at a constant minimum height sufficient to preclude oxide formation in said molten silicon.

2. The melting crucible as claimed in claim 1, wherein the outlet aperture is formed by a siphon projecting beyond the base level.

3. The melting crucible as claimed in claim 1, wherein the outlet aperture is additionally provided with a cover which prevents powdered silicon from entering the outlet.

4. A process of melting silicon powder charged into a melting crucible comprising the steps of:
    placing a silicon powder bed in the melting crucible;
    forming a pool of molten silicon within said powder bed by melting a part of said powder bed so that a pool of molten silicon within said powder bed and providing an incipient melting zone which in turn is covered by a zone of silicon powder;
    maintaining a minimum height of said pool of molten silicon in the melting crucible sufficient to preclude oxide formation in said molten silicon by drawing off the amount of melt exceeding this minimum height and being produced in the incipient melting zone; and
    maintaining a zone of silicon powder covering the incipient melting zone by adding silicon powder onto the zone of silicon powder.

5. The process as claimed in claim 4, wherein the minimum height of said pool of molten silicon in the melting crucible is at least 1 mm.

6. The process as claimed in claim 4, wherein the silicon powder employed has a fine-grain component which passes through a sieve of mesh size about 1 mm and whose proportion to the total amount of silicon is at least 1% by weight.

7. The process as claimed in claim 4, wherein the silicon powder is added continously.

8. The process as claimed in claim 4, wherein the silicon powder is added batchwise.

9. The process for melting silicon powder as set forth in claim 4, wherein the drawing off of the molten silicon from the crucible occurs in a zone thereof below said incipient melting zone, whereby the flow of material and heat in the incipient melting zone is undisturbed.

* * * * *